(12) United States Patent
Vanselow et al.

(10) Patent No.: US 6,593,818 B2
(45) Date of Patent: Jul. 15, 2003

(54) CIRCUIT CONFIGURATION FOR THE COMPENSATION OF LEAKAGE CURRENTS IN A VOLTAGE-CONTROLLED OSCILLATOR OF A PLL CIRCUIT

(75) Inventors: Frank Vanselow, Freising (DE); Leonardo Curradi, Milan (IT)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/087,299

(22) Filed: Mar. 1, 2002

(65) Prior Publication Data

US 2002/0121939 A1 Sep. 5, 2002

(51) Int. Cl.$^7$ ................................................. H03L 7/00
(52) U.S. Cl. .......................................... 331/17; 327/156
(58) Field of Search ............................... 331/17, 25, 26, 331/28, 33, DIG. 2; 327/146, 147, 155, 156, 159; 375/376

(56) References Cited

U.S. PATENT DOCUMENTS 4,191,976 A * 3/1980 Braun .......................... 360/51
5,254,958 A * 10/1993 Flach et al. ................... 331/10
6,345,173 B1 * 2/2002 Fourtet et al. ................. 455/76

* cited by examiner

Primary Examiner—My-Trang Nu Ton
(74) Attorney, Agent, or Firm—W. Daniel Swayze, Jr.; W. James Brady; Frederick J. Telecky, Jr.

(57) ABSTRACT

In a circuit configuration for the compensation of leakage currents in a voltage-controlled oscillator (12) of a PLL circuit (10), a control voltage is applied to the oscillator by way of a loop filter (20), which is generated by a phase detector (16) as a function of the phase difference between the phase of a reference signal ($f_{ref}$) and the phase of the signal output by the voltage-controlled oscillator (12). This oscillator (12) contains varicap diodes (28, 30), as circuit elements to influence the frequency, to which the control voltage is applied via a control line (34). A compensation circuit (K) is provided with varicap diodes (36, 38) in the same configuration as those in the oscillator (12), and a voltage-follower-mode connected operational amplifier (40) with a differential output is provided which has an input (41) that is connected to the control line (34). It reproduces at one of its outputs (44) the control voltage which it applies to the varicap diodes (36, 38) in the compensation circuit (K). From its other output (46) it supplies a current equal to the leakage current of the varicap diodes (36, 38) in the compensation circuit (K). A current shunt-off branch leads from the control line (34), by way of which a current flows from the control line (34) which corresponds to the current supplied by the operational amplifier (40).

1 Claim, 1 Drawing Sheet

CIRCUIT CONFIGURATION FOR THE COMPENSATION OF LEAKAGE CURRENTS IN A VOLTAGE-CONTROLLED OSCILLATOR OF A PLL CIRCUIT

FIELD OF THE INVENTION

The present invention relates to a circuit configuration for the compensation of leakage currents in a voltage-controlled oscillator of a PLL circuit.

BACKGROUND OF THE INVENTION

In modern PLL circuits, the voltage-controlled oscillator is set to the required frequency value by means of a control voltage which is generated in that the output current of a charge pump charges a capacitor within a loop filter, which precedes the voltage-controlled oscillator. The output current of the charge pump, in its turn, is directly proportional to the output signal of the phase detector, normally being available within the PLL circuit. The varicap diodes normally used as frequency-determining elements in the oscillator have a temperature-dependent leakage current, which causes a constant discharge of the capacitor in the loop filter. This results in a constant phase error at the oscillator output, since the control voltage applied to the oscillator is no longer proportional to the output signal of the phase detector, but is now modified by the leakage current. Especially at high temperatures, this leakage current can assume high values, even to the extent that the PLL circuit is no longer able to remain in a latched state.

SUMMARY OF THE INVENTION

The invention provides a circuit with an arrangement in such a way that the leakage current originating from the varicap diodes can no longer exert a negative influence on the control behavior of the PLL circuit.

According to the invention, a compensation circuit is provided which contains varicap diodes in the same configuration as in the oscillator, that in the compensation circuit an operational amplifier with a differential output, connected as voltage follower, is provided which has an input connected to the control line, and which at one of its outputs reproduces the control voltage and applies it to the varicap diodes in the compensation circuit, and which at its other output supplies a current that is equal to the leakage current of the varicap diodes in the compensation circuit, and that a current shunt-off path is connected to the control line which allows a current to drain off from the control bus which corresponds to the current supplied by the operational amplifier.

In the circuit arrangement according to the invention, a current is generated which corresponds exactly to the leakage current of the varicap diodes flowing through the voltage-controlled oscillator. This current is used to compensate the leakage current, so that it can no longer cause any changes in the control voltage applied to the oscillator. The circuit, therefore, ensures stable operation of the PLL circuit over a large temperature range.

A preferred further development of the invention provides for the current shunt-off path to be the output branch of a current mirror circuit, to whose input branch is applied the current output by the operational amplifier. This embodiment allows the desired compensation of the leakage current by simple means.

DETAILED DESCRIPTION OF THE DRAWINGS

Figure 1:
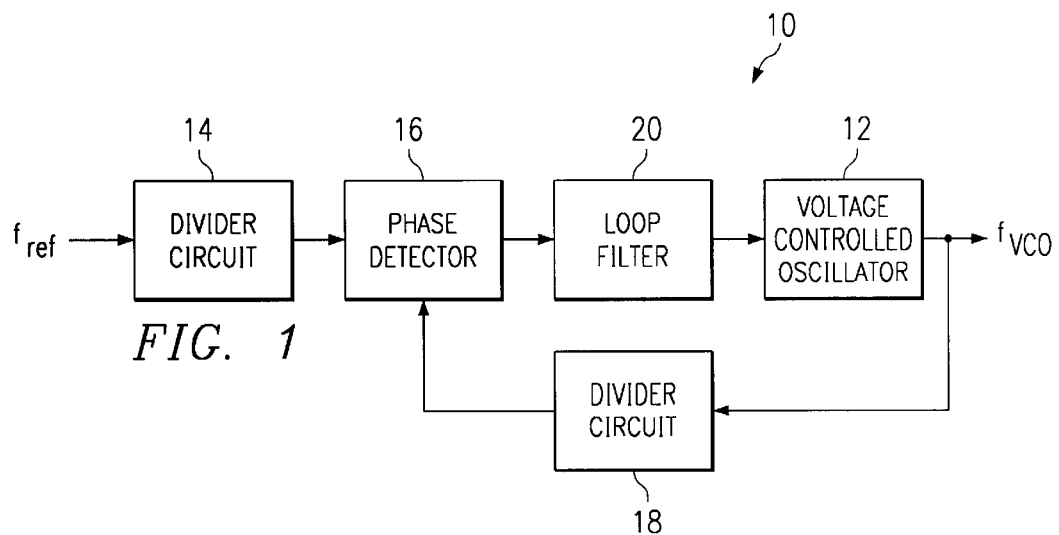
FIG. 1 is the circuit diagram of the present invention.

The PLL circuit 10 represented in FIG. 1 contains a voltage-controlled oscillator 12. The output of this oscillator 12 is at a frequency fvco which, on account of the effect of the PLL circuit 10, is in a phase-locked relationship with a reference frequency fref. This reference frequency can, for example, be generated by a crystal-controlled oscillator. This is then applied to a divider circuit 14, which divides the reference frequency by the factor M. The signal output by the divider circuit 14 is compared by a phase detector 16 with the output signal of a divider circuit 18, which divides the output frequency fvco of the voltage-controlled oscillator 12 by the factor N. The phase detector 16 outputs a signal which is proportional to the phase deviation between the signals applied to it. This signal is applied via a loop filter 20 to the voltage-controlled oscillator 12 and so controls its output frequency. The loop filter 20 normally contains a charge pump which produces a current proportional to the output signal of the phase detector 16, which charges a capacitor to a voltage which may then be used as the control voltage for the voltage-controlled oscillator 12. The output frequency fvco of the oscillator 12 is set by the control voltage in such a way that the relationship $fvco=f_{ref}(N/M)$ obtains.

Figure 2:
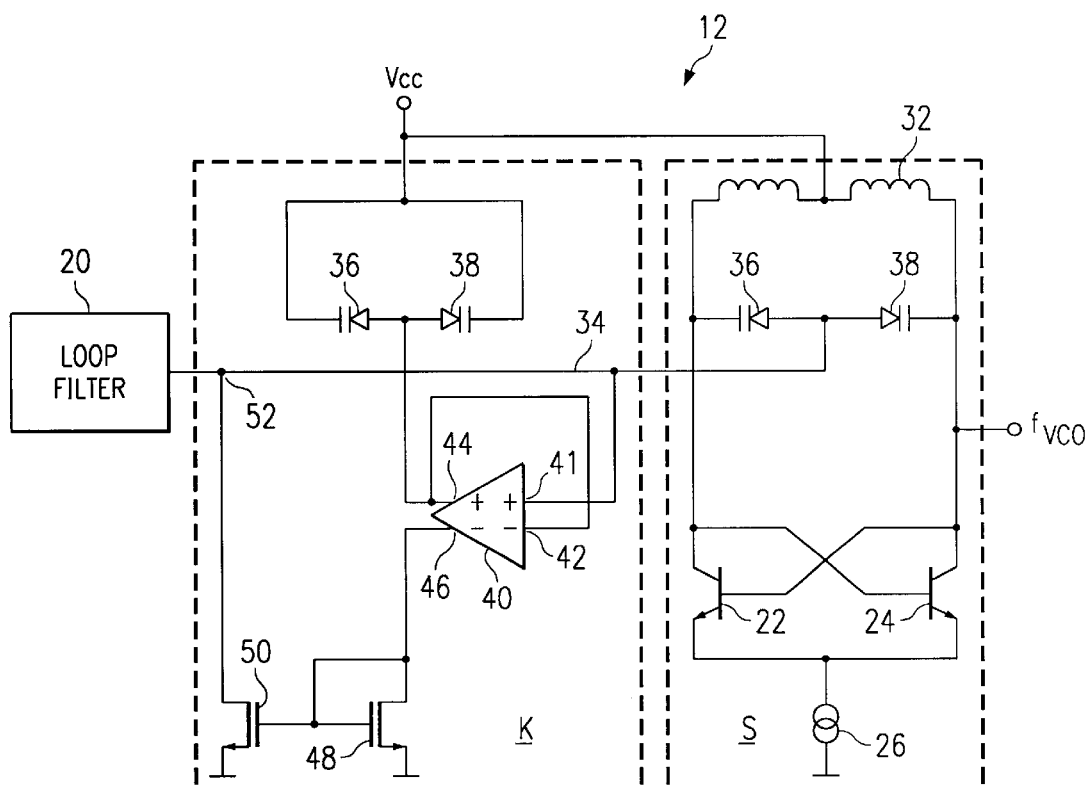
FIG. 2 is a circuit diagram of the components of the circuit arrangement according to the invention.

The embodiment of the voltage-controlled oscillator 12 is represented in more detail in FIG. 2. It comprises the oscillator circuit section S. This circuit section S contains two bipolar transistors 22, 24, whose interconnected emitters are grounded via a current source 26. The base of both transistors 22, 24 is connected to the collector of the opposite transistor in each case. The collector of each of the transistors 22, 24 is connected to the cathode of varicap diodes 28 and 30, respectively, whose anodes are interconnected. Connected in parallel with these two varicap diodes 28, 30 is a coil 32 whose centre tap is connected to the supply voltage Vcc. The control voltage supplied by the loop filter 20 is applied to the interconnected anodes of both varicap diodes 28, 30 by way of the control line 34, by means of which the frequency fvco, generated by the oscillator 12, can be determined.

The voltage-controlled oscillator 12 furthermore comprises a compensation circuit K, containing two varicap diodes 36, 38, which are arranged in the same configuration as the varicap diodes 28, 30 in the circuit section S. This means that the cathodes are connected to the supply rail Vcc, and that the anodes are connected to each other. The compensation circuit K furthermore contains an operational amplifier 40 with a differential output, which, by connecting its inverting input 42 to the non-inverting output 44, is connected in a voltage-follower mode. The non-inverting input 41 of this operational amplifier 40 is connected to the control line 34. Between the inverting output 46 of the operational amplifier 40 and ground is the drain/source path of a field-effect transistor 48, which, together with a further field-effect transistor 50, forms a current mirror. The drain/source path of the field-effect transistor 50 is between the control line 34 and ground. The gates of both the field-effect transistors 48 and 50 are connected to each other and to the inverting output 46 of the operational amplifier 40.

The function of the circuit arrangement represented in FIG. 2 is as follows:

Let it be assumed that the loop filter 20 supplies a control voltage via the control line 34 which causes the oscillator circuit section S to generate a specific output frequency fvco. A temperature-related leakage current then flows through the varicap diodes 28, 30 which, without the action of the compensation circuit, would cause a change in the control voltage present in the control bus 34, and consequently also lead to a change of the frequency fvco generated in the circuit section S.

The operational amplifier, connected in voltage follower mode, makes sure that exactly the same voltage is present at the varicap diodes 36 and 38 as at the varicap diodes 28, 30. This is achieved by having the operational amplifier 40 connected as a voltage follower, which means that the same voltage is present at its output 44 as is also applied to its non-inverting input 41. Since the same voltage is therefore present at the varicap diodes 36, 38 as well as at the varicap diodes 28, 30, the leakage current flowing at the same temperature will be the same. This leakage current also flows, via the inverting output 46 of the operational amplifier 40, through the field-effect transistor 48. Because of the current-mirroring effect, this leakage current will also flow through the field-effect transistor 50. At the circuit point 52, the leakage current flowing through the field-effect transistor 50 is, therefore, subtracted from the current flowing through the varicap diodes 28, 30, so that it does not lead to a discharge of the capacitor contained in the loop filter 20, whose charge voltage constitutes the control voltage for the voltage-controlled oscillator 12. The leakage current through the varicap diodes 28, 30 therefore does not affect on the control voltage, instrumental in generating the desired output frequency fvco. The circuit arrangement described, therefore, compensates the temperature-dependent leakage current flowing through the varicap diodes 28, 30 in the voltage-controlled oscillator 12, thus ensuring that the oscillator 12 can generate the frequency fvco, exclusively determined by the control voltage provided by the loop filter 20, even when the temperature conditions change.

What is claimed is:

1. A PPL circuit having a reference signal comprising:

a voltage controlled oscillator having first varicap diodes and to output a voltage signal;

a loop filter connected to said voltage controlled oscillator;

a compensation circuit to compensate leakage currents of said voltage controlled oscillator;

a phase detector to generate a control voltage which is input to said loop filter, said control voltage being a function of a phase difference between a phase of said reference signal and a phase of said voltage signal;

said compensation circuit having an operational amplifier connected in a voltage follower mode, second varicap diodes in the same configuration as said first varicap diodes, and a differential output;

said compensation circuit connected to said voltage controlled oscillator by a control line, where one of said differential output outputs a signal that approximates said control signal and is connected to said first varicap diodes; and wherein said other output of said differential output outputs a current equal to the leakage from said second varicap diodes.

* * * * *